(12) United States Patent
Kast

(10) Patent No.: US 9,162,389 B2
(45) Date of Patent: Oct. 20, 2015

(54) DEVICE FOR HOT EMBOSSING OF A POLYMER LAYER

(71) Applicant: EV Group E. Thallner GmbH, St. Florian (AT)

(72) Inventor: Michael Kast, Wels (AT)

(73) Assignee: EV Group E. Thallner GmbH, St. Florian (AT)

( * ) Notice: Subject to any disclaimer, the term of this patent is extended or adjusted under 35 U.S.C. 154(b) by 0 days.

(21) Appl. No.: 14/259,227

(22) Filed: Apr. 23, 2014

(65) Prior Publication Data

US 2014/0227377 A1      Aug. 14, 2014

Related U.S. Application Data

(62) Division of application No. 12/859,413, filed on Aug. 19, 2010, now Pat. No. 8,741,204.

(30) Foreign Application Priority Data

Aug. 22, 2009   (EP) ..................................... 09010780

(51) Int. Cl.
| | | |
|---|---|---|
| *B29C 59/02* | (2006.01) | |
| *B28B 1/00* | (2006.01) | |
| *H05B 6/02* | (2006.01) | |
| *B82Y 10/00* | (2011.01) | |
| *B82Y 40/00* | (2011.01) | |
| *G03F 7/00* | (2006.01) | |
| *B29C 35/02* | (2006.01) | |
| *B29L 31/00* | (2006.01) | |

(52) U.S. Cl.
CPC ........... *B29C 59/022* (2013.01); *B29C 35/0288* (2013.01); *B29C 59/02* (2013.01); *B82Y 10/00* (2013.01); *B82Y 40/00* (2013.01); *G03F 7/0002* (2013.01); *B29C 35/0272* (2013.01); *B29C 2059/023* (2013.01); *B29L 2031/7562* (2013.01)

(58) Field of Classification Search
CPC .. B29C 59/022; B29C 59/02; B29C 35/0288; B29C 35/0272; B29C 2059/023
USPC ............................. 425/3, 174.4, 385, DIG. 33
See application file for complete search history.

(56) References Cited

U.S. PATENT DOCUMENTS

| | | | |
|---|---|---|---|
| 2,393,541 A | 1/1946 | Kohler | 219/634 |
| 2,817,618 A | 12/1957 | Hahn | 156/209 |
| 3,945,790 A | 3/1976 | Puech | 425/385 |
| 5,483,043 A | 1/1996 | Sturman et al. | 219/647 |
| 6,056,844 A | 5/2000 | Guiles et al. | 156/272.4 |
| 6,764,737 B2 | 7/2004 | Arakawa et al. | 428/64.1 |
| 6,939,477 B2 | 9/2005 | Stark et al. | 252/62.54 |
| 7,193,193 B2 | 3/2007 | Bergstrom et al. | 219/635 |

(Continued)

FOREIGN PATENT DOCUMENTS

| | | | |
|---|---|---|---|
| DE | 102006004644 | 8/2007 | ............. B62D 29/00 |
| EP | 1 316 402 | 6/2003 | ............. B29C 43/22 |

(Continued)

*Primary Examiner* — Joseph S Del Sole
*Assistant Examiner* — Thukhanh T Nguyen
(74) *Attorney, Agent, or Firm* — Kusner & Jaffe

(57) ABSTRACT

A device for hot embossing of a magnetic nanoparticle (N)-containing polymer layer. The device includes an embossing die, a pressure application means and a magnetic field generating means. The embossing die and the pressure application means are made from materials that do not respond thermally to a magnetic field.

12 Claims, 2 Drawing Sheets

(56) References Cited

U.S. PATENT DOCUMENTS

| | | | |
|---|---|---|---|
| 7,348,374 B2 | 3/2008 | Martinazzo | 524/431 |
| 7,674,346 B2 | 3/2010 | Clements et al. | 156/272.2 |
| 7,887,739 B2 | 2/2011 | Chou et al. | 264/402 |
| 8,263,129 B2 * | 9/2012 | DeSimone et al. | 264/293 |
| 2003/0234470 A1 | 12/2003 | Haan et al. | H05B 6/02 |
| 2009/0061152 A1 | 3/2009 | DeSimone et al. | 428/131 |
| 2009/0127253 A1 | 5/2009 | Stark et al. | 219/660 |
| 2009/0194913 A1 | 8/2009 | Chang et al. | 264/447 |

FOREIGN PATENT DOCUMENTS

| | | | |
|---|---|---|---|
| WO | WO 00/18591 | 4/2000 | B44F 1/12 |
| WO | WO 03/099536 | 12/2003 | B29C 43/36 |

* cited by examiner

DEVICE FOR HOT EMBOSSING OF A POLYMER LAYER

RELATED APPLICATIONS

This application is a divisional of U.S. application Ser. No. 12/859,413, filed Aug. 19, 2010, which claims priority from European Patent Application No. 09010780.6, filed Aug. 22, 2009, said patent applications hereby fully incorporated herein by reference.

FIELD OF THE INVENTION

The invention relates to a device for hot embossing of a polymer layer and a method for hot embossing of a magnetic nanoparticle-containing polymer layer.

BACKGROUND OF THE INVENTION

In micro- and nanoengineering, hot embossing is used for transfer of a microscale or nanoscale pattern into a polymer layer. Here a flat substrate is first coated with a polymer and then is brought into contact with a prestructured die. Then the polymer is heated to liquefy it. The die is then pressed into the liquid polymer layer at a defined pressure. It is especially important to apply an embossing pressure which is as uniform as possible over the entire surface of the substrate. Then the polymer layer is molded by the die at a predefined temperature and cooled to room temperature.

Hot embossing is used among others for producing micro-optical structures, microfluidic components and magnetic data media.

Compared to photolithographic methods, the throughput for the above described hot embossing method is lower due to the thermal processes. For use of the hot embossing method in industrial mass production, for example production of hard disks or display screens, there would therefore be a demand for optimized throughput times. The maximum throughput time results from the sum of pumping-out time, heat-up time, embossing time, cooling time, molding time and ventilation time.

Different approaches such as shortening of thermal cycles, for example by use of polymers with low glass transition temperature, or the external cooling of the substrate after the embossing process have not shown the desired effects or have entailed other disadvantages. Thus, for example with partial heating of the embossing system due to different expansions of the individual components a distortion could be observed in the structure transition.

SUMMARY OF THE INVENTION

The object of the invention is therefore to devise a device and a method for hot embossing of a polymer layer onto a substrate in which the throughput is optimized and energy use is reduced.

This object is achieved with the features of the claims. Advantageous developments of the invention are given in the dependent claims. All combinations of at least two features given in the specification, the claims and/or the figures fall within the framework of the invention. For indicated value ranges values which lie within these boundaries will also be disclosed as boundary values and can be claimed in any combination.

The invention is based on the idea of devising a device with a thermal mass which has been reduced to a minimum, so that heating and cooling times in hot embossing can be shortened as effectively as possible. For this purpose, as claimed in the invention there is a temperature raising device, especially a magnetic field generating device, which is made specifically to heat up the polymer layer. This drastically reduces the thermal inertia of the device as claimed in the invention.

Nanoparticles or nanoscale particles for the purposes of this invention are particles with a particle size of less than 500 nm, especially less than 200 nm, preferably less than 50 nm. Magnetic in the sense of this invention means ferromagnetic, ferrimagnetic, paramagnetic or superparamagnetic.

The object is achieved especially in that the thermal mass of the hot embossing device is reduced to the mass of the polymer layer to be embossed, and the temperature of the polymer layer penetrated with magnetic nanoparticles is raised by exposing the magnetic nanoparticles to a preferably high frequency alternating magnetic field. In this way, in contrast to conventional hot embossing methods, only the polymer layer to be embossed or parts of the polymer layer to be embossed are heated to the necessary embossing temperature and heating or cooling of the entire hot embossing device is eliminated. In one advantageous configuration of the invention it is provided that the magnetic field generating means is made to produce an especially high frequency alternating magnetic field which is homogeneous preferably at least in the region of the polymer layer. The homogeneous alternating magnetic field uniformly heats the polymer layer without distortions or uneven softening occurring.

Advantageously there is an application means for applying a polymer layer to the substrate, especially integrated into the device so that application of the polymer layer can take place within the device and in this way the throughput is further increased. The substrate can be a wafer. The polymer layer is applied in a spin, spray or inkjet method.

In another advantageous embodiment of the invention it is provided that the pressure application means comprises a pressure cylinder for application of a defined pressure to the embossing die. Advantageously there is a compensation layer between the pressure cylinder or the embossing die and/or between the substrate and a receiving means. Instead of a pressure cylinder there can also be a membrane or a combination of a pressure cylinder and membrane.

Advantageously there is moreover a temperature measurement means which operates especially without contact for measurement of the temperature of the polymer layer. It can be used for optimum process control by a corresponding control means. In order to generate an optimum and uniform magnetic field, the embossing die and/or the substrate are made nonconductive so that the magnetic field generating means can be located underneath and/or above the polymer layer and can produce a magnetic field which is uniformly distributed over the surface of the polymer layer.

To the extent the device is made to intrinsically heat a polymer layer, a minimum of energy is used for heating of the polymer layer. This is achieved especially in that the components of the device consist of materials which do not respond to the alternating magnetic field.

In the method as claimed in the invention for hot embossing of a magnetic nanoparticle-containing polymer layer, especially onto a substrate, first, the polymer or the substrate which is to be coated with the polymer layer is placed in the device, especially by a robot arm, specifically on the substrate receiver. Then, to avoid air inclusions in the polymer layer, a vacuum is applied in the embossing space. Subsequently and/or during vacuum application, the polymer layer is heated with the magnetic field generating means by the magnetic nanoparticles which are distributed as uniformly as possible in the polymer layer being heated by the magnetic field which is as homogeneous as possible. The magnetic field is a high frequency alternating magnetic field. The substrate itself can be formed by the polymer layer, especially when embossing takes place from both sides of the polymer layer.

After softening of the polymer layer, especially detected by the temperature measurement means for measurement of the temperature of the polymer layer, pressure is applied to the heated polymer layer with the embossing die, particularly by a pressure application means, especially consisting of a pressure cylinder which holds the embossing die. The pressure application means can also be made to act on the substrate.

Softening of the polymer layer is dependent on the material or on the material composition of the polymer layer and softening begins with the glass transition temperature. Accordingly pressure application begins advantageously at a temperature above the glass transition temperature.

After completed pressure application, the polymer layer is cooled; this takes place within an extremely short time by the heating which has advantageously taken place intrinsically, since the other components of the device were not heated at all or were heated only insignificantly. Below the softening point of the polymer layer the embossing die is separated from the polymer layer which has at least partially set.

The pressure application means can also be made to act from both sides of the polymer layer or on two polymer layers.

Other advantages, features and details of the invention will become apparent from the following description of preferred exemplary embodiments and using the drawings.

DETAILED DESCRIPTION OF PREFERRED EMBODIMENT

The same components and components with the same function are identified with the same reference numbers in the figures.

Figure 1:
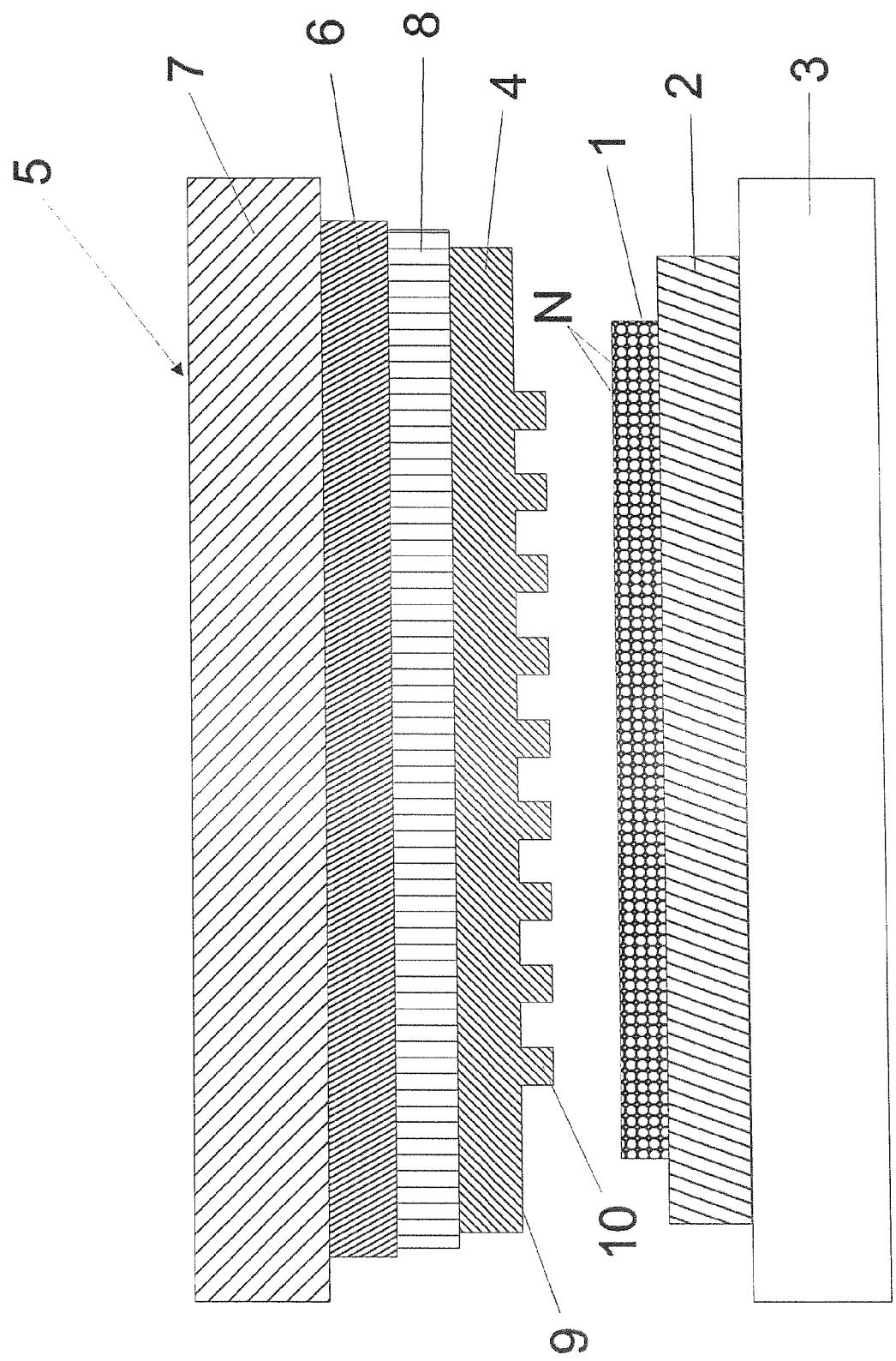
FIG. 1 shows a schematic of a device as claimed in the invention in a first embodiment.

FIG. 1 shows a substrate 2 which is to be provided with a polymer layer 1 on a substrate holder 3. The substrate holder 3 can be a chuck and the substrate 2 is applied to the substrate holder 3 by a robot arm which is not shown and is unloaded again after application of the polymer layer 1.

The polymer layer 1 contains magnetic nanoparticles N which are distributed as uniformly as possible in the polymer layer 1.

The polymer layer 1 is applied or placed for example by spin lacquering, lamination or joining to the substrate during embossing or by inkjet methods.

Opposite the substrate holder 3 a pressure application means 5 is fixed on the device and the pressure application means 5 has a pressure cylinder 7 which can move an embossing die 4 which is attached to the pressure cylinder 7 in the direction of the substrate 2. The embossing die 4 and the substrate 2 are aligned or can be aligned flush and parallel to one another.

Between the embossing die 4 and the pressure cylinder 7 there is a compensation layer 8 and a magnetic field generating means 6 which is made as a magnetic coil in the exemplary embodiment.

So that in the exemplary embodiment as shown in FIG. 1 a homogeneous magnetic field can be applied to the polymer layer 1, the components of the device, here the compensation layer 8 and the embossing die 4, which are located between the magnetic field generating means 6 and the polymer layer 1, are made nonconductive.

The magnetic coil can likewise be located underneath the substrate 2, the substrate 2 then having to be made nonconductive.

The compensation layer 8 can likewise be located underneath the substrate 2 in order to ensure the function of homogeneous pressure distribution over the surface of the substrate 2.

Alternatively the compensation layer 8 can be made to act in a fluid manner, especially isostatically.

The pressure cylinder 7 can also be made to act on the substrate holder 3 and thus the substrate 2, instead of on the embossing die 4, in this case the embossing die 4 being held fixed by a die holder.

Figure 2:
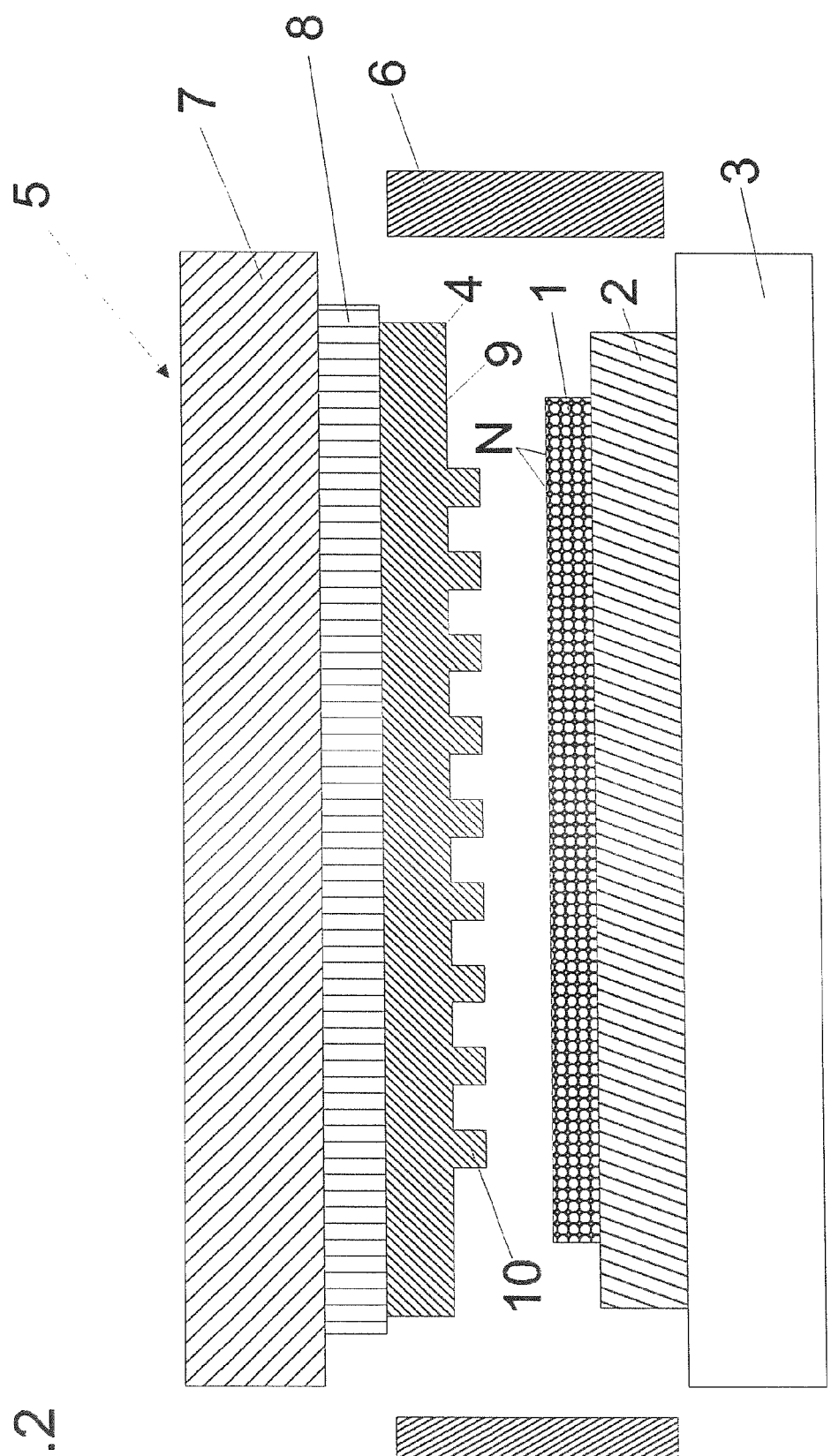
FIG. 2 shows a schematic of a device as claimed in the invention in a second embodiment.

In the exemplary embodiment of this invention shown in FIG. 2 the magnetic field generating means 6 is arranged laterally from the polymer layer 1, especially surrounding the polymer layer 1 in a ring shape. In this embodiment any embossing die 4 and any substrate 2 can be used.

When pressure is applied to the heated polymer layer 1 with the embossing die 4 by the pressure cylinder 7, an embossing structure 10 provided on one embossing side 9 of the embossing die 4 is embossed into the polymer layer 1.

Having described the invention, the following is claimed:

1. Device for hot embossing of a magnetic nanoparticle (N)-containing polymer layer onto a substrate, the device including:
    an embossing die disposed opposite the polymer layer,
    a pressure application means that applies pressure to the embossing die and/or the substrate to force the embossing die and the polymer layer into contact with each other, and
    a magnetic field generating means that heats the polymer layer by generating a magnetic field to excite the magnetic nanoparticles (N),
    wherein the embossing die and the pressure application means are made from materials that do not respond thermally to a magnetic field.

2. Device as claimed in claim 1, wherein the magnetic field generating means produces a high frequency alternating magnetic field which is homogeneous.

3. Device as claimed in claim 1, further comprising an application means for applying the polymer layer to the substrate.

4. Device as claimed in claim 1, wherein the pressure application means comprises a pressure cylinder for application of a defined pressure to the embossing die and/or the substrate.

5. Device as claimed in claim 1, further comprising a temperature measurement means that measures the temperature of the polymer layer.

6. Device as claimed in claim 1, wherein the substrate is made from a material that does not respond thermally to a magnetic field.

7. Device as claimed in claim 1, further comprising a compensation layer for homogeneous pressure distribution during embossing.

8. Device as claimed in claim 1, wherein the device is made to intrinsically heat the polymer layer.

9. Device as claimed in claim 2, wherein the high frequency alternating magnetic field is homogeneous at least in the region of the polymer layer.

10. Device as claimed in claim 5, wherein the temperature measurement means does not contact the polymer layer.

11. Device as claimed in claim 1, a substrate holder for receiving the substrate wherein the pressure application means applies pressure to the substrate holder.

12. Device as claimed in claim 7, wherein the compensation layer acts isostatically.

\* \* \* \* \*